(12) United States Patent
Koo et al.

(10) Patent No.: US 7,986,177 B2
(45) Date of Patent: Jul. 26, 2011

(54) SEMICONDUCTOR DEVICE

(75) Inventors: Ja-Beom Koo, Gyeonggi-do (KR);
Dong-Suk Shin, Gyeonggi-do (KR)

(73) Assignee: Hynix Semiconductor Inc.,
Gyeonggi-do (KR)

( * ) Notice: Subject to any disclaimer, the term of this patent is extended or adjusted under 35 U.S.C. 154(b) by 0 days.

(21) Appl. No.: 12/494,355

(22) Filed: Jun. 30, 2009

(65) Prior Publication Data

US 2010/0164573 A1 Jul. 1, 2010

(30) Foreign Application Priority Data

Dec. 26, 2008 (KR) .................. 10-2008-0134943

(51) Int. Cl.
*H03L 7/06* (2006.01)
(52) U.S. Cl. ........................ 327/158; 327/149
(58) Field of Classification Search .................. 327/149, 327/158
See application file for complete search history.

(56) References Cited

U.S. PATENT DOCUMENTS

| 5,663,665 | A  | * | 9/1997  | Wang et al. ................ 327/3 |
| 6,667,643 | B2 | * | 12/2003 | Ko ........................... 327/158 |
| 6,703,879 | B2 | * | 3/2004  | Okuda et al. .............. 327/158 |
| 6,970,047 | B1 | * | 11/2005 | Johnson et al. ............ 331/45 |
| 6,977,605 | B2 | * | 12/2005 | Lee et al. ................... 341/161 |
| 7,084,682 | B2 | * | 8/2006  | Jeon et al. ................. 327/158 |
| 7,208,988 | B2 | * | 4/2007  | Murata et al. ............. 327/148 |
| 7,262,647 | B2 | * | 8/2007  | Chou .......................... 327/158 |
| 7,295,053 | B2 | * | 11/2007 | Lesso .......................... 327/158 |
| 7,459,949 | B2 | * | 12/2008 | Mai .............................. 327/158 |
| 7,482,850 | B2 | * | 1/2009  | Kawamoto ................. 327/158 |
| 7,495,486 | B2 | * | 2/2009  | Lee ............................. 327/158 |
| 7,675,334 | B2 | * | 3/2010  | Kawamoto ................. 327/158 |
| 2007/0210842 | A1 | * | 9/2007 | Kawamoto ................. 327/158 |
| 2009/0134924 | A1 | * | 5/2009 | Kawamoto ................. 327/158 |
| 2009/0167387 | A1 | * | 7/2009 | Kim ............................. 327/157 |
| 2010/0013530 | A1 | * | 1/2010 | Kim et al. .................. 327/149 |
| 2010/0117694 | A1 | * | 5/2010 | Kim ............................. 327/157 |
| 2010/0164573 | A1 | * | 7/2010 | Koo et al. ................... 327/158 |
| 2010/0164574 | A1 | * | 7/2010 | Modi et al. ................. 327/158 |

FOREIGN PATENT DOCUMENTS

| KR | 100613059 | 8/2006 |
| KR | 100824790 | 4/2008 |
| KR | 100824791 | 4/2008 |
| KR | 100878030 | 1/2009 |

OTHER PUBLICATIONS

Notice of Allowance issued from Korean Intellectual Property Office on Oct. 25, 2010.

* cited by examiner

*Primary Examiner* — Lincoln Donovan
*Assistant Examiner* — Adam D Houston
(74) *Attorney, Agent, or Firm* — IP & T Group LLP

(57) ABSTRACT

A semiconductor device, includes a clock delay unit configured to include a plurality of delay units connected in series, where the delay amount of each delay unit varies depending on a level of a control voltage, for delaying a source clock to generate a feedback clock and mixing clocks outputted from the respective delay units to generate a frequency multiplication clock, a harmonic lock determination unit configured to determine whether a harmonic lock has occurred based on a frequency difference between the source clock and the frequency multiplication clock, and a control voltage generator configured to adjust a level of the control voltage based on a phase difference between the source clock and the feedback clock and a determination result of the harmonic lock determination unit.

29 Claims, 6 Drawing Sheets

SEMICONDUCTOR DEVICE

CROSS-REFERENCE TO RELATED APPLICATION

The present application claims priority of Korean Patent Application No. 10-2008-0134943, filed on Dec. 26, 2008, the disclosure of which is incorporated herein by reference in its entirety.

BACKGROUND OF THE INVENTION

The present invention relates to a semiconductor design technology, and more particularly, to a frequency multiplier and multi phase clock generator for use in a semiconductor device that uses Delay Locked Loop (DLL).

Generally, a semiconductor device such as Double Data Rate Synchronous Dynamic Random Access Memory (DDR SDRAM) receives an external clock and uses it as a reference clock to match various operation timings.

However, when a plurality of circuits provided in the semiconductor device is operated by using such an external clock, clock skew may occur due to its delay in a path through which the external clock is transmitted. In order to compensate for this clock skew, the semiconductor device is provided with a clock synchronizing circuit.

Such a clock synchronizing circuit can be implemented in two ways such as Phase Locked Loop (PLL) and DLL. Therefore, the semiconductor device performs various signal transmission/reception operations with external devices by using an internal clock synchronized with an external clock provided by the clock synchronizing circuit.

Basically, the PLL and DLL are similar to each other in configuration and operation, but distinguishable from each other in that the PLL uses a Voltage Controlled Oscillator (VCO) in generating an internal clock corresponding to an external clock, while the DLL utilizes a Voltage Controlled Delay Line (VCDL).

FIG. 1 is a block diagram showing a frequency multiplier and multi phase clock generator for use in a semiconductor device which employs DLL according to the prior art.

Referring to FIG. 1, the prior art frequency multiplier and multi phase clock generator includes a clock delay unit 100, having a plurality of delay units UNIT_DLY<1:N> connected in series, where each delay unit has a delay amount that varies depending on a level of a control voltage CTRL_VOL, for delaying a source clock REF_CLK to output a feedback clock FEDB_CLK and mixing multi phase clocks MTPS_CLK<1:N−1> from the respective delay units UNIT_DLY<1:N> to output a frequency multiplication clock FREQ_MTP_CLK; a phase detector 120 for detecting a phase difference between the source clock REF_CLK and the feedback clock FEDB_CLK to generate phase detection signals LVUP and LVDN; and a voltage level adjustor 140 for adjusting a level of the control voltage CTRL_VOL in response to the phase detection signals LVUP and LVDN.

Here, the phase detection signals LVUP and LVDN outputted from the phase detector 120 are provided as an up phase detection signal LVUP and a down phase detection signal LVDN based on a phase difference between the source clock REF_CLK and the feedback clock FEDB_CLK, where active intervals of each of the phase detection signals clock LVUP and LVDN do not overlap those of the other one of the phase detection signals clock LVUP and LVDN.

To be more specific, the phase detector 120 compares a reference edge of the source clock REF_CLK with a reference edge of the feedback clock FEDB_CLK, wherein the reference edge is generally a rising edge. Alternatively, the reference edge in another example, may be a falling edge. If a reference edge of the feedback clock FEDB_CLK lags behind a reference edge of the source clock REF_CLK, the phase detector 120 activates the up phase detection signal LVUP, and if a reference edge of the feedback clock FEDB_CLK precedes a reference edge of the source clock REF_CLK, it activates the down phase detection signal LVDN.

At this time, the length of active intervals of the up phase detection signal LVUP and the down phase detection signal LVDN varies depending on a difference between reference edges of the source clock REF_CLK and the feedback clock FEDB_CLK. That is, if a difference between them is relatively large, the length of active intervals of the up phase detection signal LVUP or the down phase detection signal LVDN becomes relatively larger. On the other hand, if a difference between them is relatively small, the length of active intervals of the up phase detection signal LVUP or the down phase detection signal LVDN becomes also relatively smaller.

The voltage level adjustor 140 is provided with a charge pumping unit 142 and a loop filter 144. The charge pumping unit 142 generates a control current CTRL_I having a magnitude corresponding to the length of active intervals of the up phase detection signal LVUP and the down phase detection signal LVDN, and supplies it to the loop filter 144. Then, the loop filter 144 performs a charging or discharging operation depending on the magnitude of the control current CTRL_I to adjust a level of the control voltage CTRL_VOL.

The clock delay unit 100 is provided with a plurality of delay units UNIT_DLY<1:N> 102 connected in series, and a frequency multiplication clock generator 104 for mixing multi phase clocks MTPS_CLK<1:N−1> outputted from the respective delay units UNIT_DLY<1:N> 102 to generate a frequency multiplication clock FREQ_MTP_CLK.

At this time, as the level of the control voltage CTRL_VOL rises, each of the delay units UNIT_DLY<1:N> 102 provided in the clock delay unit 100 has a decreased delay amount; and as the level of the control voltage CTRL_VOL decreases, each of the delay units UNIT_DLY<1:N> 102 has an increased delay amount.

Therefore, as the level of the control voltage CTRL_VOL rises, the entire delay amount of the clock delay unit 100 decreases and thus a delay time of the source clock REF_CLK decreases to generate the feedback clock FEDB_CLK. Similarly, as the level of the control voltage CTRL_VOL decreases, the entire delay amount of the clock delay unit 100 increases and thus a delay time of the source clock REF_CLK increases in generating the feedback clock FEDB_CLK.

Also, as the level of the control voltage CTRL_VOL rises, the phase difference between the multi phase clocks MTPS_CLK<1:N−1> outputted from the respective delay units UNIT_DLY<1:N> 102 provided in the clock delay unit 100 decreases. Likewise, as the level of the control voltage CTRL_VOL decreases, the phase difference between the multi phase clocks MTPS_CLK<1:N−1> from the respective delay units UNIT_DLY<1:N> 102 provided in the clock delay unit 100 increases.

Therefore, as the level of the control voltage CTRL_VOL rises, the frequency of the frequency multiplication clock FREQ_MTP_CLK rises. Similarly, as the level of the control voltage CTRL_VOL decreases, the frequency of the frequency multiplication clock FREQ_MTP_CLK decreases.

Now, the operation of the frequency multiplier and multi phase clock generator for the semiconductor device that uses DLL according to the prior art having the above-mentioned configuration will be described in detail.

FIGS. 2A to 2C are timing diagrams describing the operation of the frequency multiplier and multi phase clock generator for the semiconductor device that uses DLL according to the prior art shown in FIG. 1.

FIG. 2A shows a case where the prior art frequency multiplier and multi phase clock generator normally operates, and FIGS. 2A and 2B illustrate cases where it operates abnormally due to occurrence of harmonic locking.

First, the basic operation of DLL will be explained. Such DLL is used for synchronizing a reference edge of the source clock REF_CLK with a reference edge of the feedback clock FEDB_CLK, and performs the operation of increasing or decreasing the delay amount of the clock delay unit 100 for achieving the above purpose.

At this time, the feedback clock FEDB_CLK is generated by delaying the source clock REF_CLK. Therefore, when comparing them, a reference edge of the feedback clock FEDB_CLK always lags behind a reference edge of the source clock REF_CLK. Due to presence of a minimum delay amount of the delay unit 100, a reference edge of the source clock REF_CLK cannot be synchronized with a reference edge of the feedback clock FEDB_CLK.

Thus, this DLL is operative to synchronize a reference edge of the source clock REF_CLK which lags behind its original reference edge by one clock cycle 1 tck with a reference edge of the feedback clock FEDB_CLK. Upon completion of the locking operation of the DLL, the phase difference between the source clock REF_CLK and the feedback clock FEDB_CLK should be exactly one clock cycle 1 tck. That is, the phase difference should have the state as shown in FIG. 2A.

At this time, in the state of FIG. 2A, since the delay amount of the clock delay unit 100 is kept at one clock cycle 1 tclk, if the number of delay units UNIT_DLY provided in the clock delay unit 100 is N, a delay amount of each of the delay units UNIT_DLY<1:N> becomes 1 tck/N and a phase difference between the multi phase clocks MTPS_CLK<1:N-1> also equals a time interval corresponding to 1 tck/N. Also, the frequency of the frequency multiplication clock FREQ_MTP_CLK outputted from the clock delay unit 100 becomes N/2 of the frequency of the source clock REF_CLK.

However, such DLL is not normally locked due to external effects such as variations in Process, Voltage, Temperature (PVT) or unknown malfunction causes, and may thus be harmonic locked, as in FIGS. 2B and 2C.

First, referring to FIG. 2B, it can be seen that the DLL should operate in a way that the reference edge of the feedback clock FEDB_CLK can be synchronized with the reference edge of the source clock REF_CLK which lags behind its original reference edge by one clock cycle 1 tck, but is operative to synchronize the reference edge of the feedback clock FEDB_CLK with the reference edge of the source clock REF_CLK which lags behind its original reference edge by one clock cycles 2 tck.

In this case, upon completion of locking operation of the DLL, the phase difference between the source clock REF_CLK and the feedback clock FEDB_CLK is two clock cycles 2 tck, which becomes twice one clock cycle 1 tck as intended.

Also, in the state of FIG. 2B, the delay amount of the clock delay unit 100 is kept at two clock cycles 2 tck of the source clock REF_CLK. Therefore, if the number of delay units UNIT_DLY provided in the clock delay unit 100 is N, the delay amount of each of the delay units UNIT_DLY<1:N> becomes 2 tck/N and the phase difference between the multi phase clocks MTPS_CLK<1:N-1> also equals a time interval corresponding to 2 tclk/N. In addition, the frequency of the frequency multiplication clock FREQ_MTP_CLK outputted from the clock delay unit 100 becomes N/4 of the frequency of the source clock REF_CLK.

That is, in the state of FIG. 2B, there is a problem that the phase difference between the multi phase clocks MTPS_CLK<1:N> becomes twice larger than that as originally intended, and the frequency of the frequency multiplication clock FREQ_MTP_CLK also becomes twice smaller than that as originally intended.

Next, referring to FIG. 2C, it can be seen that the DLL should operate in a way that the reference edge of the feedback clock FEDB_CLK can be synchronized with the reference edge of the source clock REF_CLK which lags behind its original reference edge by one clock cycle 1 tck, but is operative to synchronize the reference edge of the source clock REF_CLK with the reference edge of the feedback clock FEDB_CLK.

In this case, since the minimum delay amount of the clock delay unit 100 is not 0, there is a problem that the locking operation of the DLL cannot be completed. Thus, the normal multi phase clocks MTPS_CLK<1:N-1> and frequency multiplication clock FREQ_MTP_CLK cannot be generated.

As described above, in order to prevent occurrence of harmonic locking in DLL operation, the prior art frequency multiplier and multi phase clock generator employed the method which enables a locking operation to be normally performed by resetting the delay amount of the clock delay unit 100 to the initial state through the use of a separate reset signal upon detection of harmonic locking occurred.

This method of using the separate reset signal must not only additionally include a circuit which detects occurrence of harmonic locking but also initialize the DLL by applying such a reset signal thereto each time harmonic locking has occurred. However, this existing method cannot predict when harmonic locking has occurred and also has difficulty in controlling timing since harmonic locking may again occur due to external impacts even when locking operation is normally completed by the initialization process.

SUMMARY OF THE INVENTION

An embodiment of the present invention is directed to providing a frequency multiplier and multi phase clock generator for use in a semiconductor device that uses DLL, which is capable of essentially preventing occurrence of harmonic locking during a locking operation.

In accordance with the present invention, there is a semiconductor device, including a clock delay unit configured to include a plurality of delay units connected in series, where the delay amount of each delay unit varies depending on a level of a control voltage, for delaying a source clock to generate a feedback clock and mixing clocks outputted from the respective delay units to generate a frequency multiplication clock, a harmonic lock determination unit configured to determine whether a harmonic lock has occurred based on a frequency difference between the source clock and the frequency multiplication clock, and a control voltage generator configured to adjust a level of the control voltage based on a phase difference between the source clock and the feedback clock and a determination result of the harmonic lock determination unit.

In accordance with another aspect of the present invention, there is provided a semiconductor device, including a clock delay unit configured to include a delay unit, whose delay amount is decided depending on a level of a control voltage, for delaying a source clock to generate a feedback clock, a harmonic lock determination unit configured to detect a level of the source clock at a preset reference edge of the feedback clock to determine whether a harmonic lock has occurred, and a control voltage generator configured to adjust a level of the control voltage based on a phase difference between the source clock and the feedback clock and a determination result of the harmonic lock determination unit.

In accordance with further aspect of the present invention, there is provided a semiconductor device, including a clock delay unit configured to include a plurality of delay units connected in series, where the delay amount of each delay unit varies depending on a level of a control voltage, for delaying a source clock to generate a feedback clock and mixing clocks outputted from the respective delay units to generate a frequency multiplication clock, a phase detector configured to detect a phase difference between the source clock and the feedback clock to generate a phase detection signal, a frequency detector configured to detect a frequency difference between the source clock and the frequency multiplication clock to generate a frequency detection signal, a level detector configured to detect a level of the source clock at a preset reference edge of the feedback clock to generate a level detection signal, and a voltage level adjustor configured to adjust a level of the control voltage in response to the phase detection signal, the frequency detection signal and the level detection signal.

In accordance with still another aspect of the present invention, there is provided a semiconductor device, including a clock delay unit configured to include a plurality of delay units connected in series, where the delay amount of each delay unit varies depending on a level of a control voltage, for delaying a source clock to generate a feedback clock and mixing clocks outputted from the respective delay units to generate a frequency multiplication clock, a frequency detector configured to detect a frequency difference between the source clock and the frequency multiplication clock to generate a frequency detection signal, a level detector configured to detect a level of the source clock at a preset reference edge of the feedback clock to generate a level detection signal, a phase detector configured to detect a phase difference between the source clock and the feedback clock to generate a level up signal and a level down signal based on a detection result, the frequency detection signal and the level detection signal, and a voltage level adjustor configured to raise a level of the control voltage in response to the level up signal and lower a level of the control voltage in response to the level down signal.

DESCRIPTION OF SPECIFIC EMBODIMENTS

Other objects and advantages of the present invention can be understood by the following description, and become apparent with reference to the embodiments of the present invention.

Hereinafter, preferred embodiments of the present invention will be described in detail with reference to the accompanying drawings. However, the present invention is not restricted to the embodiments disclosed below, but may be configured in different types. The present embodiments are provided to complete the disclosure of the invention and to enable those skilled in the art to understand the full scope of the invention.

Figure 1:
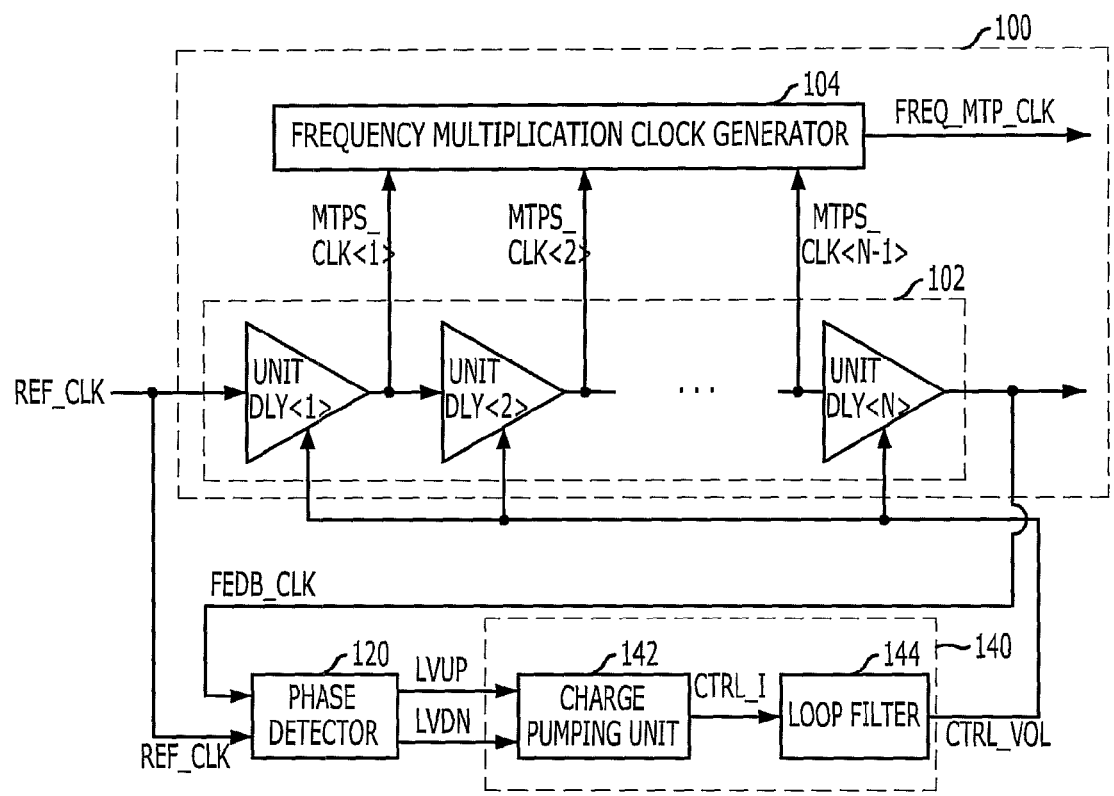
FIG. 1 is a block diagram showing a frequency multiplier and multi phase clock generator for use in a semiconductor device which employs DLL according to the prior art.
Figure 2A:
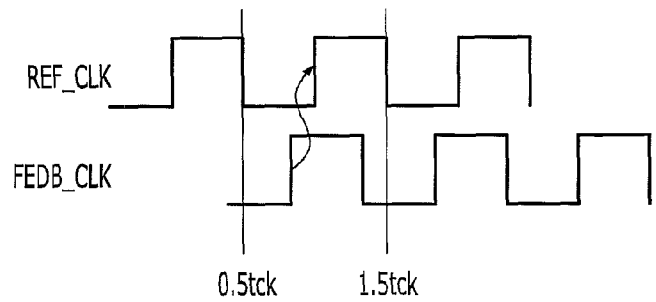
FIGS. 2A to 2C are timing diagrams showing operation waveforms of the frequency multiplier and multi phase clock generator for use in the semiconductor device using DLL according to the prior art depicted in FIG. 1.
Figure 2B:
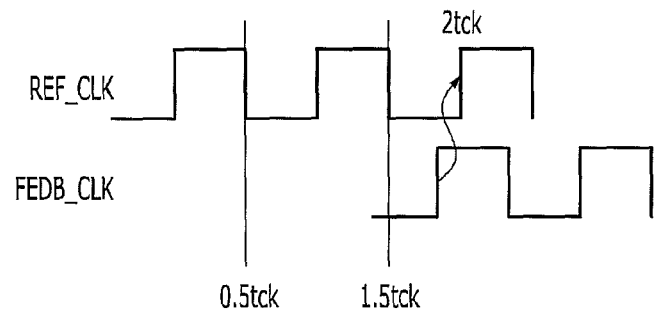
Figure 2C:
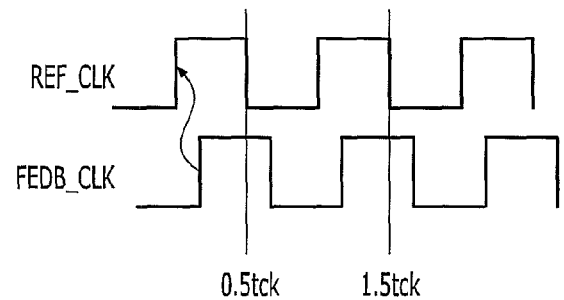
Figure 3:
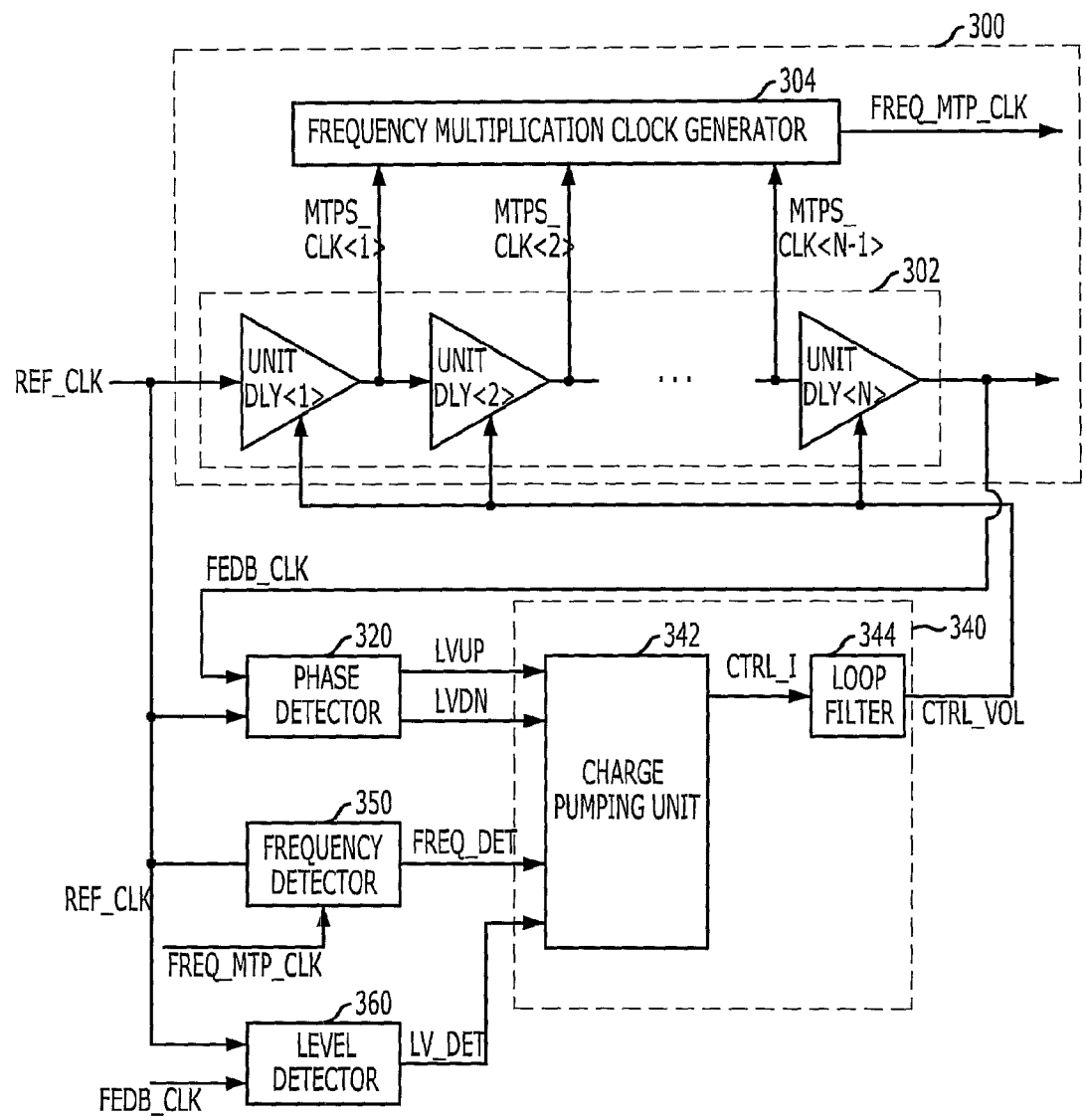
FIG. 3 is a block diagram showing a frequency multiplier and multi phase clock generator for use in a semiconductor device that uses DLL in accordance with a first embodiment of the present invention.

FIG. 3 is a block diagram showing a frequency multiplier and multi phase clock generator for use in a semiconductor device that uses DLL in accordance with a first embodiment of the present invention.

Referring to FIG. 3, the frequency multiplier and multi phase clock generator in accordance with the first embodiment includes a clock delay unit 300 having a plurality of delay units UNIT_DLY<1:N> connected in series, where the delay amount of each delay unit varies depending on a level of a control voltage CTRL_VOL, for delaying a source clock REF_CLK to output a feedback clock FEDB_CLK and mixing multi phase clocks MTPS_CLK<1:N−1> from the respective delay units UNIT_DLY<1:N> to output a frequency multiplication clock FREQ_MTP_CLK; a phase detector 320 for detecting a phase difference between the source clock REF_CLK and the feedback clock FEDB_CLK to generate phase detection signals LVUP and LVDN; a frequency detector 350 for detecting a frequency difference between the source clock REF_CLK and the frequency multiplication clock FREQ_MTP_CLK to generate a frequency detection signal FREQ_DET; a level detector 360 for detecting a level of the source clock REF_CLK at a preset reference edge of the feedback clock FEDB_CLK to generate a level detection signal LV_DET where the preset reference edge does not indicate an absolute rising or falling edge but indicates a rising or falling edge that satisfies predetermined conditions; and a voltage level adjustor 340 for adjusting a level of the control voltage CTRL_VOL in response to the phase detection signals LVUP and LVDN, the frequency detection signal FREQ_DET and the level detection signal LV_DET.

Here, the phase detection signals LVUP and LVDN outputted from the phase detector 320 are provided as an up phase detection signal LVUP and a down phase detection signal LVDN based on the phase difference between the source clock REF_CLK and the feedback clock FEDB_CLK, and where active intervals of each of the phase detection signals clock LVUP and LVDN do not overlap those of the other one of the phase detection signals clock LVUP and LVDN.

To be more specific, the phase detector 320 compares a reference edge of the source clock REF_CLK with a reference edge of the feedback clock FEDB_CLK, wherein the reference edge is generally a rising edge, but in another example, may be a falling edge. If a reference edge of the feedback clock FEDB_CLK lags behind a reference edge of the source clock REF_CLK, the phase detector 320 activates the up phase detection signal LVUP, and if a reference edge of the feedback clock FEDB_CLK precedes a reference edge of the source clock REF_CLK, it activates the down phase detection signal LVDN.

At this time, the length of active intervals of the up phase detection signal LVUP and the down phase detection signal LVDN varies depending on a difference between reference edges of the source clock REF_CLK and the feedback clock FEDB_CLK. That is, if a difference between them is relatively large, the length of active intervals of the up phase detection signal LVUP or the down phase detection signal LVDN becomes relatively larger. On the other hand, if a difference between them is relatively small, the length of active intervals of the up phase detection signal LVUP or the down phase detection signal LVDN becomes also relatively smaller.

Also, the clock delay unit 300 is provided with a plurality of delay units UNIT_DLY<1:N> 302 connected in series, and a frequency multiplication clock generator 304 for mixing multi phase clocks MTPS_CLK<1:N−1> outputted from the respective delay units UNIT_DLY<1:N> 302 to generate the frequency multiplication clock FREQ_MTP_CLK.

At this time, as the level of the control voltage CTRL_VOL rises, each of the delay units UNIT_DLY<1:N> 302 provided in the clock delay unit 300 has a decreased delay amount, and as the level of the control voltage CTRL_VOL decreases, each of the delay units UNIT_DLY<1:N> 302 has an increased delay amount.

Therefore, as the level of the control voltage CTRL_VOL rises, the entire delay amount of the clock delay unit 300 decreases and thus a delay time of the source clock REF_CLK decreases to generate the feedback clock FEDB_CLK. Similarly, as the level of the control voltage CTRL_VOL decreases, the entire delay amount of the clock delay unit 300 increases and thus a delay time of the source clock REF_CLK increases to generate the feedback clock FEDB_CLK.

Also, as the level of the control voltage CTRL_VOL rises, the phase difference between the multi phase clocks MTPS_CLK<1:N−1> from the respective delay units UNIT_DLY<1:N> 302 provided in the clock delay unit 300 decreases. Likewise, as the level of the control voltage CTRL_VOL decreases, the phase difference between the multi phase clocks MTPS_CLK<1:N−1> from the respective delay units UNIT_DLY<1:N> 302 provided in the clock delay unit 300 increases.

Therefore, as the level of the control voltage CTRL_VOL rises, the frequency of the frequency multiplication clock FREQ_MTP_CLK rises. Similarly, as the level of the control voltage CTRL_VOL decreases, the frequency of the frequency multiplication clock FREQ_MTP_CLK decreases.

The frequency detector 350 inactivates the frequency detection signal FREQ_DET if a time interval corresponding to one clock cycle 1 tck of the source clock REF_CLK is greater than a time interval corresponding to one clock cycle of the frequency multiplication clock FREQ_MTP_CLK by a multiplication factor equal to or more than a preset multiplication factor. On the other hand, it activates the frequency detection signal FREQ_DET if a time interval corresponding to one clock cycle of the source clock REF_CLK is greater than a time interval corresponding to one clock cycle of the frequency multiplication clock FREQ_MTP_CLK by less than a preset multiplication factor.

That is, if a locking operation is normally performed without occurrence of harmonic locking and thus a phase difference between the source clock REF_CLK and the feedback clock FEDB_CLK corresponds to one clock cycle 1 tck of the source clock REF_CLK, the frequency of the frequency multiplication clock FREQ_MTP_CLK should be greater than the frequency of the source clock REF_CLK by a multiplication factor equal to or more than a preset multiplication factor.

However, if harmonic locking has occurred and thus a phase difference between the source clock REF_CLK and the feedback clock FEDB_CLK corresponds to two or more clock cycles (tck), the frequency of the frequency multiplication clock FREQ_MTP_CLK should be greater than the frequency of the source clock REF_CLK by less than a preset multiplication factor, not by the preset multiple.

Thus, if a time interval corresponding to one clock cycle 1 tck of the source clock REF_CLK is greater than a time interval corresponding to one clock cycle of the frequency multiplication clock FREQ_MTP_CLK by a multiplication factor equal to or more than a preset multiplication factor, the frequency detector 350 determines that a harmonic locking has not occurred and thus inactivates the frequency detection signal FREQ_DET and outputs it. On the other hand, if a time interval corresponding to one clock cycle 1 tck of the source clock REF_CLK is greater than a time interval corresponding to one clock cycle of the frequency multiplication clock FREQ_MTP_CLK by less than a preset multiplication factor, the frequency detector 350 determines that a harmonic locking has occurred and thus activates the frequency detection signal FREQ_DET and outputs it.

The level detector 360 activates the level detection signal LV_DET and outputs it when levels of odd (or even or other non-consecutive sequential orders such as multiples of n where n is any natural number) toggling pulses of the source clock REF_CLK are in an active state at reference edges of odd (or even or other non-consecutive sequential orders such as multiples of n where n is any natural number) toggling pulses of the feedback clock FEDB_CLK, wherein the reference edge is generally a rising edge of odd (or even or other sequential orders such as multiples of n where n is any natural number) toggling pulses but in another example, may be a falling edge thereof). On the other hand, it inactivates the level detection signal LV_DET and outputs it when levels of odd (or even or other sequential orders such as multiples of n where n is any natural number) toggling pulses of the source clock REF_CLK are in an inactive state at reference edges of odd (or even or other sequential orders such as multiples of n where n is any natural number) toggling pulses of the feedback clock FEDB_CLK. Here, n is a natural number greater than 2.

At this time, the process, in which a locking operation is normally performed, adopts the following method. That is, a locking operation first starts in a state where a phase difference between the source clock REF_CLK and the feedback clock FEDB_CLK is less than one clock cycle 1 tck of the source clock REF_CLK. Then, the delay amount of the clock delay unit 300 is increased more and more, and if a phase difference between the source clock REF_CLK and the feedback clock FEDB_CLK exceeds one clock cycle 1 tck of the source clock REF_CLK, the delay amount of the clock delay unit 300 is decreased again. In this way, through the operation in which the delay amount of the clock delay unit 300 is repeatedly increased and decreased, when a phase difference between the source clock REF_CLK and the feedback clock FEDB_CLK is exactly equal to one clock cycle 1 tck of the source clock REF_CLK, the locking operation is completed.

In other words, when the locking operation is normally performed without occurrence of harmonic locking, the reference edge of the feedback clock FEDB_CLK repeatedly precedes and lags behind the reference edge of the source clock REF_CLK and the level of the source clock REF_CLK is repeatedly switched between being activated at logic 'low' and deactivated at logic 'high' at the reference edge of the feedback clock FEDB_CLK.

During this operation, when the reference edge of the feedback clock FEDB_CLK precedes the reference edge of the source clock REF_CLK by one clock cycle 1 tck due to occurrence of harmonic locking, the phase detector 320 intends to synchronize the reference edge of the feedback clock FEDB_CLK with a reference edge of the source clock REF_CLK which precedes its original reference edge by one clock cycle 1 tck by further decreasing the delay amount of the clock delay unit 400. However, since the minimum value of the clock delay unit 300 is not '0', the reference edge of the feedback clock FEDB_CLK still lags behind the reference edge of the source clock REF_CLK by one clock cycle 1 tck. That is, the level of the source clock REF_CLK is still activated to logic 'high' at the reference edge of the feedback clock FEDB_CLK.

Thus, the level detector 360 activates or inactivates the level detection signal LV_DET by detecting the state that the level of the source clock REF_CLK is activated to logic 'high' at the reference edge of the feedback clock FEDB_CLK. However, if it is determined that a harmonic locking has occurred by considering only the state that the level of the source clock REF_CLK is activated to logic 'high' at the reference edge of the feedback clock FEDB_CLK, there may be a problem that determines that a harmonic locking has occurred even when the level of the source clock REF_CLK is activated to logic 'high' at the reference edge of the feedback clock FEDB_CLK during the normal locking operation.

Thus, the level detector 360 does not detect a level of every toggling pulse of the source clock REF_CLK at every reference edge of the feedback clock FEDB_CLK, but detects levels of odd (or even or other sequential orders such as multiples of n where n is any natural number) toggling pulses of the source clock REF_CLK at the reference edges of odd (or even or other sequential orders such as multiples of n where n is any natural number) toggling pulses of the feedback clock FEDB_CLK, thereby preventing that the normal locking state is determined as a harmonic locking state. At this time, determining based on the odd toggling pulses of the feedback clock FEDB_CLK and the odd toggling pulses of the source clock REF_CLK is to make sure that the reference clock to be locked is not included in the selected toggling pulses of the feedback clock FEDB_CLK and the source clock REF_CLK. That is, detecting levels of odd (or even or other sequential orders such as multiples of n where n is any natural number) toggling pulses of the source clock REF_CLK at the reference edge of odd (or even or other sequential orders such as multiples of n where n is any natural number) toggling pulses of the feedback clock FEDB_CLK can prevent that the reference edge of the feedback clock FEDB_CLK is to be locked into the reference edge of a pulse positioned before or after the reference edge of the source clock REF_CLK to be locked.

Thus, when levels of odd (or even or other sequential orders such as multiples of n where n is any natural number) toggling pulses of the source clock REF_CLK are activated to logic 'high' at reference edges of odd (or even or other sequential orders such as multiples of n where n is any natural number) toggling pulses of the feedback clock FEDB_CLK, the level detector 360 determines that a harmonic locking has occurred and activates the level detection signal LV_DET and outputs it. On the other hand, when levels of odd (or even or other sequential orders such as multiples of n where n is any natural number) toggling pulses of the source clock REF_CLK are inactivated to logic 'low' at reference edges of odd (or even or other sequential orders such as multiples of n where n is any natural number) toggling pulses of the feedback clock FEDB_CLK, it determines that a harmonic locking has not occurred and inactivates the level detection signal LV_DET and outputs it.

The voltage level adjustor 340 raises the level of the control voltage CRTL_VOL in response to activation of the up phase detection signal LVUP or activation of the frequency detection signal FREQ_DET upon inactivation of the level detection signal LV_DET, and lowers the level of the control voltage CRTL_VOL in response to activation of the down phase detection signal LVDN or activation of the level detection signal LV_DET upon inactivation of the frequency detection signal FREQ_DET.

That is, the operations of raising and lowering the level of the control voltage CTRL_VOL by the voltage level adjustor 340 cannot occur simultaneously, and the level change operation of the control voltage CTRL_VOL based on the activation of the level detection signal LV_DET and the frequency detection signal FREQ_DET should have priority to the level change operation of the control voltage CTRL_VOL based on the activation of the phase detection signals LVUP and LVDN.

Thus, the phase detector 320 may erroneously determine that a harmonic lock state is a normal locking state, and hence can activate the up phase detection signal LVUP. At this time, if the level detection signal LV_DET has been activated, it needs to lower the level of the control voltage CTRL_VOL corresponding to the activation of the level detection signal LV_DET by disregarding the up phase detection signal LVUP that has been activated.

Likewise, the phase detector 320 may erroneously determine that a harmonic lock state is a normal locking state, and thus can activate the down phase detection signal LVDN. At this time, if the frequency detection signal FREQ_DET has been activated, it needs to raise the level of the control voltage CTRL_VOL corresponding to the activation of the frequency detection signal FREQ_DET by disregarding the down phase detection signal LVDN that has been activated.

Because of this, the level detection signal LV_DET should be in an inactivated state to raise the level of the control voltage CTRL_VOL in response to the activation of the up phase detection signal LVUP outputted from the phase detector 320.

Similarly, the frequency detection signal FREQ_DET should be in an inactivated state to lower the level of the control voltage CTRL_VOL in response to the activation of the down phase detection signal LVDN outputted from the phase detector 320.

Figure 4:
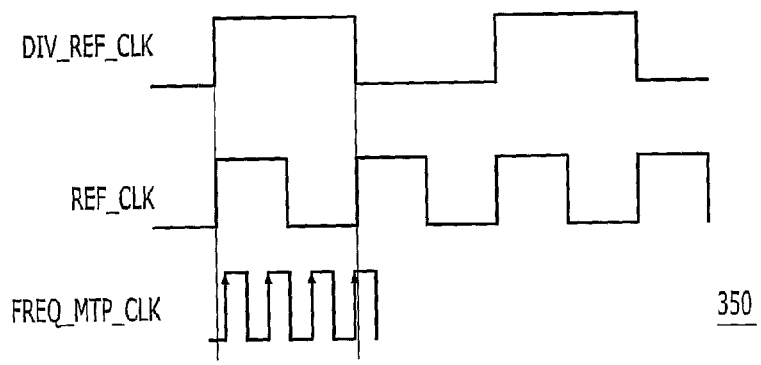
FIG. 4 shows a detailed circuit diagram of the frequency detector among the components of the frequency multiplier and multi phase clock generator for use in the semiconductor device that uses DLL in accordance with the first embodiment of the present invention depicted in FIG. 3.
Figure 4:
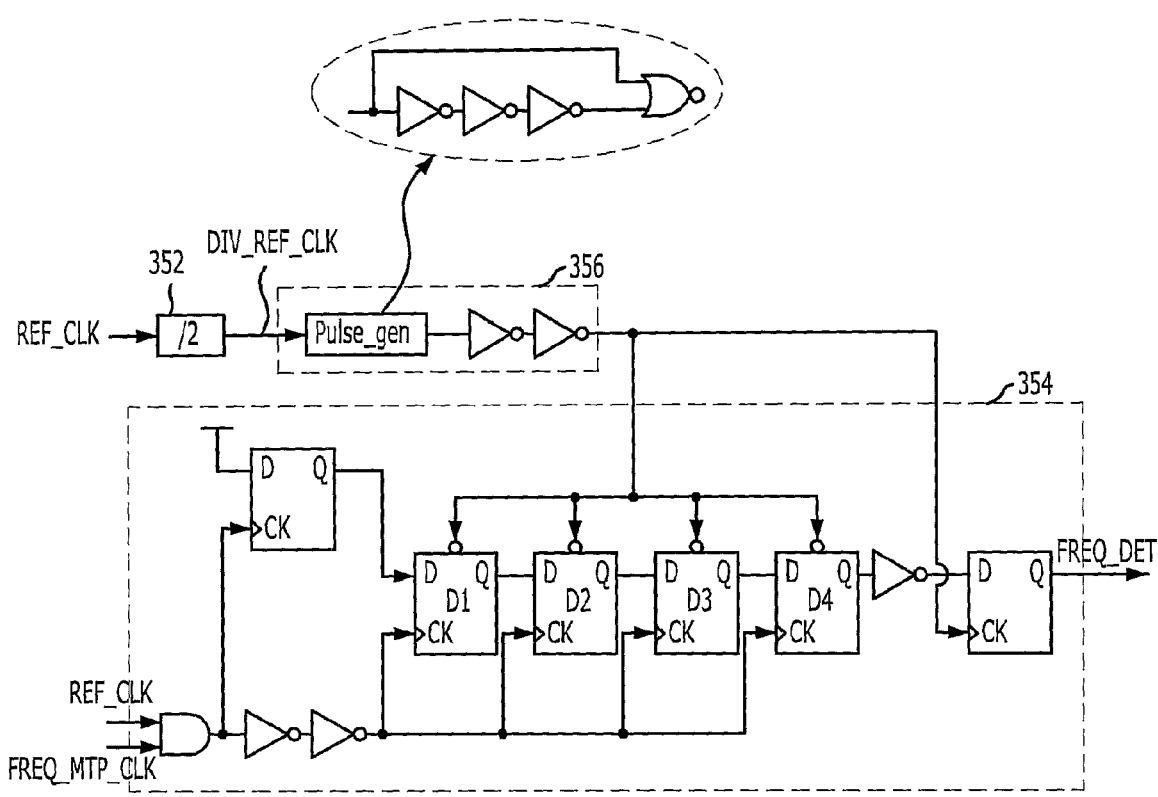

FIG. 4 illustrates a detailed circuit diagram of the frequency detector among the components of the frequency multiplier and multi phase clock generator for the semiconductor device that uses DLL in accordance with the first embodiment of the present invention depicted in FIG. 3.

Referring to FIG. 4, the frequency detector 350 of this embodiment is provided with a clock divider 352 for two-dividing the source clock REF_CLK to output a divided source clock DIV_REF_CLK, an edge counter 354 for counting the number of reference edges of the frequency multiplication clock FREQ_MTP_CLK during an active interval of the divided source clock DIV_REF_CLK and outputting the frequency detection signal FREQ_DET whose logic level is determined based on the counting result, and an initialization controller 356 for initializing the edge counter 354 in response to inactivation of the divided source clock DIV_REF_CLK.

Here, the clock divider 352 is a component for detecting one clock cycle 1 tck of the source clock REF_CLK. That is, one clock cycle 1 tck of the source clock REF_CLk means an interval between transitions where the source clock REF_CLK transits from logic 'low' to logic 'high' and then to logic 'low' again. It is not easy to apply to any circuit since this contains both logic low and logic high states.

Thus, by two-dividing the source clock REF_CLK to generate the divided source clock DIV_REF_CLK, one clock cycle 1 tck of the source clock REF_CLK can be represented by one logic level by using the divided source clock DIV_REF_CLK since the length of logic 'high' interval or logic 'low' interval of the divided source clock DIV_REF_CLK corresponds to one clock cycle 1 tck of the source clock REF_CLK.

The edge counter 354 outputs the frequency detection signal FREQ_DET of inactive state if the number of reference edges of the frequency multiplication clock FREQ_MTP_CLK, counted during inactivation of the divided source clock DIV_REF_CLK, i.e., during a time interval corresponding to one clock cycle 1 tck of the source clock REF_CLK, is greater than a preset number.

On the contrary, the edge counter 354 outputs the frequency detection signal FREQ_DET of active state if the number of reference edges of the frequency multiplication clock FREQ_MTP_CLK, counted during inactivation of the divided source clock DIV_REF_CLK, i.e., during a time interval corresponding to one clock cycle 1 tck of the source clock REF_CLK, is less than the preset number.

Here, the preset number used herein may be changed by changing the number of D flip-flops D1 to D4 provided in the edge counter 354. That is, the output signals of the D flip-flops D1 to D4 provided in the edge counter 354 are sequentially activated each time the reference edge of the frequency multiplication clock FREQ_MTP_CLK arises during a time interval corresponding to one clock cycle 1 tck of the source clock REF_CLK corresponding to the active interval of the divided source clock DIV_REF_CLK. If the number of reference edges of the frequency multiplication clock FREQ_MTP_CLK is smaller than the preset number, the output of the last D flip-flop D4 is not activated and thus the frequency detection signal FREQ_DET is activated. Meanwhile, if the number of reference edges of the frequency multiplication clock FREQ_MTP_CLK exceeds the preset number, the output of the last D flip-flop D4 is activated and thus the frequency detection signal FREQ_DET is inactivated.

The initialization controller 356 is for repeatedly operating the frequency detector 350 because it continuously operates even after its operation once during the locking operation. That is, the initialization controller 356 serves to initialize the edge counter 354 every completion of the operation of detecting how often a time interval corresponding to one clock cycle of the frequency multiplication clock FREQ_MTP_CLK repeats during a time interval corresponding to one clock cycle 1 tclk of the source clock REF_CLK.

Figure 5:
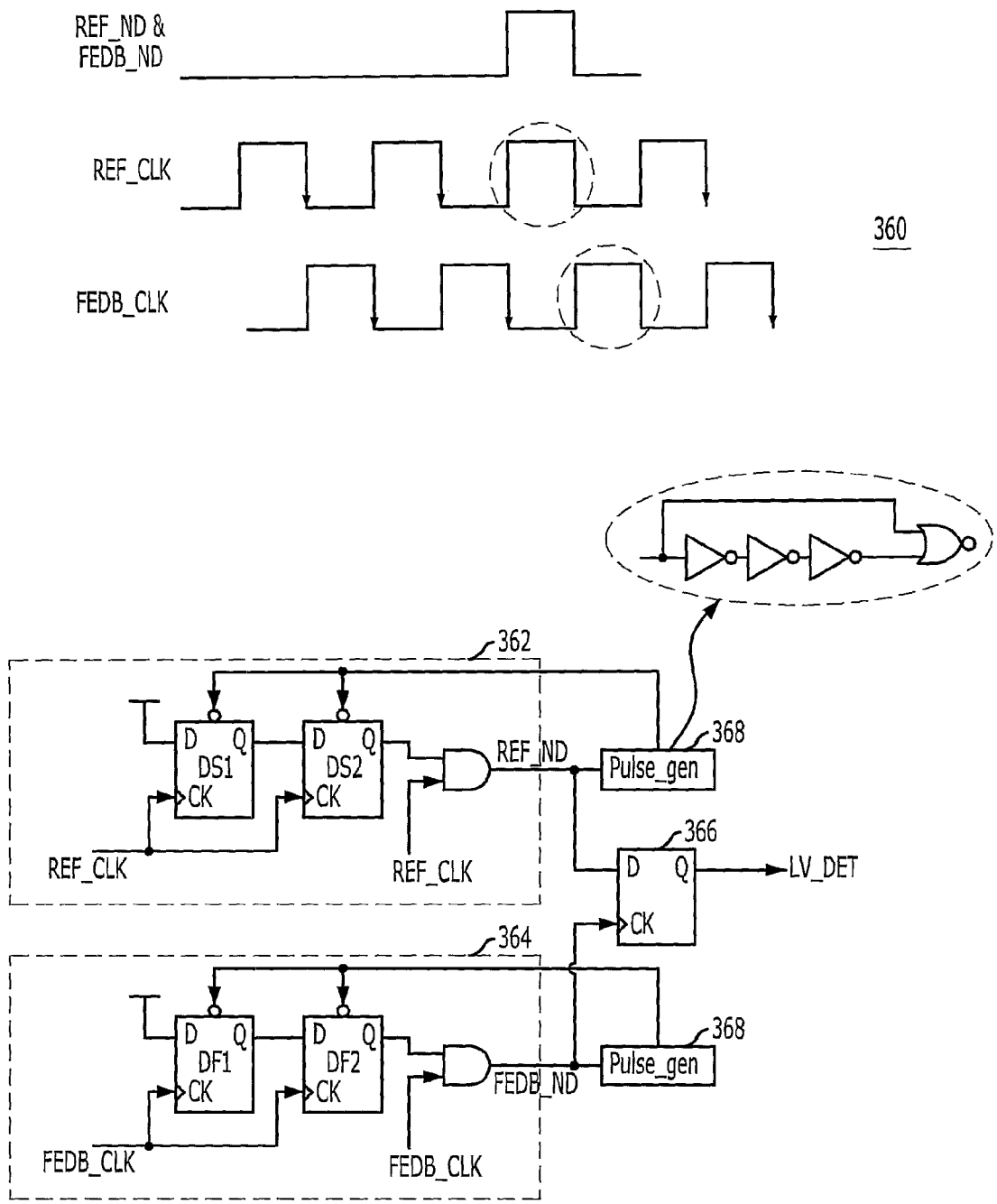
FIG. 5 shows a detailed circuit diagram of the level detector among the components of the frequency multiplier and multi phase clock generator for the semiconductor device that uses DLL in accordance with the first embodiment of the present invention depicted in FIG. 3.

FIG. 5 illustrates a detailed circuit diagram of the level detector among the components of the frequency multiplier and multi phase clock generator for the semiconductor device that uses DLL in accordance with the first embodiment of the present invention depicted in FIG. 3.

Referring to FIG. 5, the level detector 360 of this embodiment is provided with a source pulse generator 362 for counting the number of toggling pulses of the source clock REF_CLK to generate a source pulse REF_PUL corresponding to odd (or even or other sequential orders such as multiples of n where n is any natural number where n is a natural number greater than 2) togging pulses, a feedback pulse generator 364 for counting the number of toggling pulses of the feedback clock FEDB_CLK to generate a feedback pulse FEDB_PUL corresponding to odd (or even or other sequential orders such as multiples of n where n is any natural number where n is a natural number greater than 2) togging pulses, a level detection signal output unit 366 which is responsive to a level of the source pulse REF_PUL at the reference edge of the feedback pulse FEDB_PUL to output a level detection signal LV_DET whose logic level is determined, and an initialization controller 368 for initializing a count value of the source pulse generator 362 in response to inactivation of the source pulse REF_PUL and initializing a count value of the feedback pulse generator 364 in response to inactivation of the feedback pulse FEDB_PUL.

Here, the source pulse generator 362 and the feedback pulse generator 364 are identical to each other in components except that their input signals are the source clock REF_CLK and the feedback clock FEDB_CLK that are different from each other, respectively.

In addition, the source pulse generator 362 and the feedback pulse generator 364 are identical to each other in operation that the source pulse REF_PUL and the feedback pulse FEDB_PUL are outputted by selecting odd (or even or other sequential orders such as multiples of n where n is any natural number where n is a natural number greater than 2) toggling pulses out of the source clock REF_CLK and the feedback clock FEDB_CLK which consecutively toggle, respectively.

Also, it is possible to change odd (or even or other sequential orders such as multiples of n where n is any natural number where n is a natural number greater than 2) toggling pulses to be selected from the source clock REF_CLK and the feedback clock FEDB_CLK depending on the number of D flip-flops DS1 and DS2, and DF1 and DF2 provided in each of the source pulse generator 362 and the feedback pulse generator 364.

The level detection signal output unit 364 outputs the level detection signal LV_DET of active state when the source pulse REF_PUL is activated at the reference edge of the feedback pulse FEDB_PUL, and outputs the level detection signal LV_DET of inactive state when the source pulse REF_PUL is inactivated at the reference edge of the feedback pulse FEDB_PUL.

The initialization controller 368 is for repeatedly operating the level detector 360 because it continuously operates even after its operation once during the locking operation.

Figure 6:
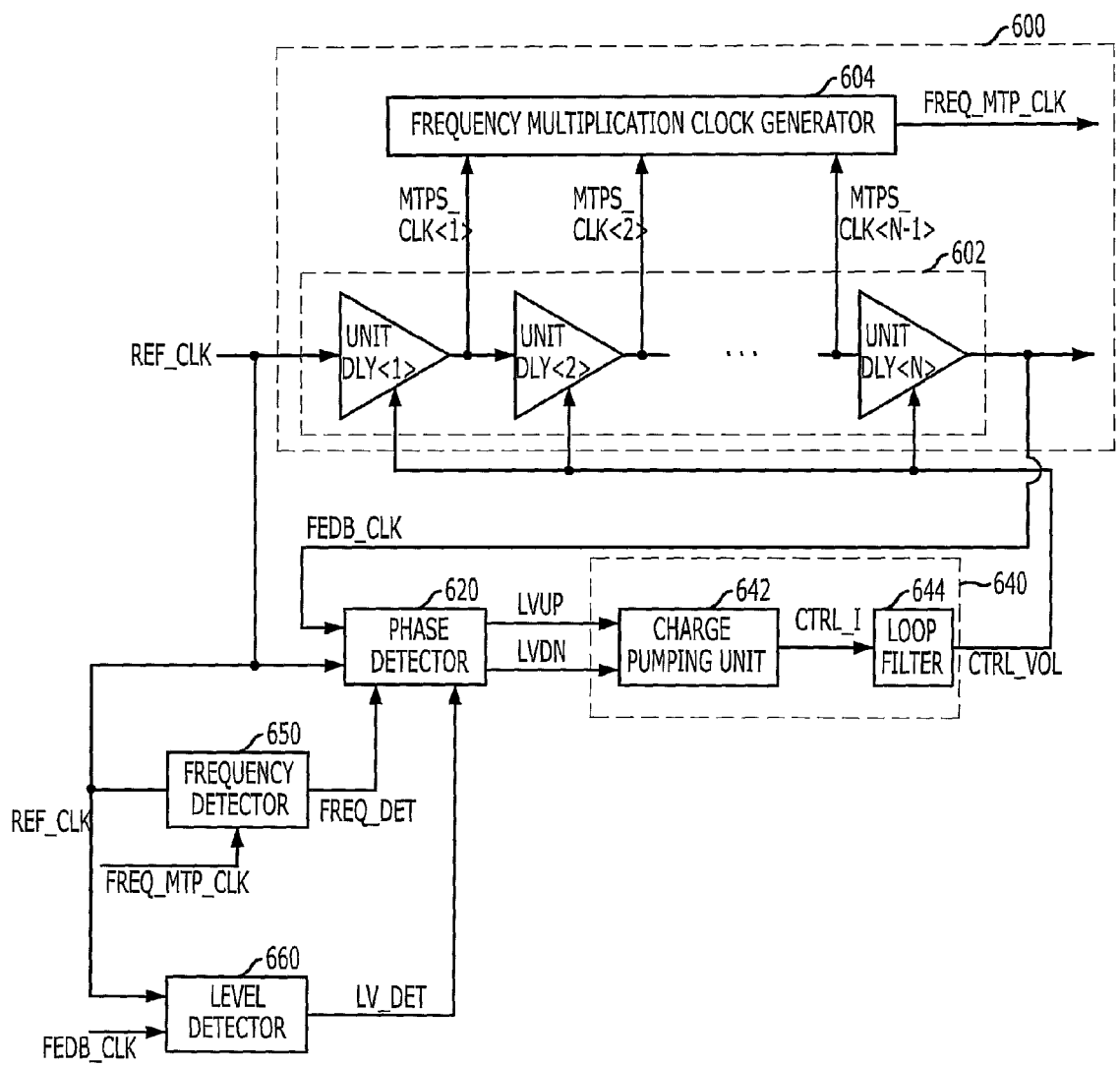
FIG. 6 is a block diagram showing a frequency multiplier and multi phase clock generator for use in a semiconductor device that uses DLL in accordance with a second embodiment of the present invention.

FIG. 6 is a block diagram showing a frequency multiplier and multi phase clock generator for use in a semiconductor device that uses DLL in accordance with a second embodiment of the present invention.

Referring to FIG. 6, the frequency multiplier and multi phase clock generator in accordance with the second embodiment includes a clock delay unit 600 having a plurality of delay units UNIT_DLY<1:N> connected in series, where the delay amount of each delay unit varies depending on a level of a control voltage CTRL_VOL, for delaying a source clock REF_CLK to output a feedback clock FEDB_CLK and mixing multi phase clocks MTPS_CLK<1:N−1> from the respective delay units UNIT_DLY<1:N> to output a frequency multiplication clock FREQ_MTP_CLK; a frequency detector 650 for detecting a frequency difference between the source clock REF_CLK and the frequency multiplication clock FREQ_MTP_CLK to generate a frequency detection signal FREQ_DET; a level detector 660 for detecting a level of the source clock REF_CLK at a preset reference edge of the feedback clock FEDB_CLK to generate a level detection signal LV_DET where the preset reference edge does not indicate an absolute rising or falling edge but a rising or falling edge that depends on predetermined conditions; a phase detector 620 for detecting a phase difference between the source clock REF_CLK and the feedback clock FEDB_CLK to generate a level up signal LVUP and a level down signal LVDN in response to the detection result and the frequency detection signal FREQ_DET and the level detection signal LV_DET; and a voltage level adjustor 640 for raising a level of the control voltage CTRL_VOL in response to the level up signal LVUP and lowering a level of the control voltage CTRL_VOL in response to the level down signal LVDN.

Here, the clock delay unit 600 is provided with a plurality of delay units UNIT_DLY<1:N> 602 connected in series, and a frequency multiplication clock generator 604 for mixing multi phase clocks MTPS_CLK<1:N−1> outputted from the delay units UNIT_DELAY<1:N> 602 to generate the frequency multiplication clock FREQ_MTP_CLK.

At this time, as the level of the control voltage CTRL_VOL rises, each of the delay units UNIT_DELAY<1:N> 602 provided in the clock delay unit 600 has a decreased delay amount, and as the level of the control voltage CTRL_VOL decreases, each of the delay units UNIT_DELAY<1:N> 602 has an increased delay amount.

Therefore, as the level of the control voltage CTRL_VOL rises, the entire delay amount of the clock delay unit 600 decreases and thus a delay time of the source clock REF_CLK decreases to generate the feedback clock FEDB_CLK. Similarly, as the level of the control voltage CTRL_VOL decreases, the entire delay amount of the clock delay unit 600 increases and thus a delay time of the source clock REF_CLK increases to generate the feedback clock FEDB_CLK.

Also, as the level of the control voltage CTRL_VOL rises, the phase difference between the multi phase clocks MTPS_CLK<1:N−1> outputted from the respective delay units UNIT_DLY<1:N> 602 provided in the clock delay unit 600 decreases. Likewise, as the level of the control voltage CTRL_VOL decreases, the phase difference between the multi phase clocks MTPS_CLK<1:N−1> from the respective delay units UNIT_DELAY<1:N> 602 provided in the clock delay unit 600 increases.

Therefore, as the level of the control voltage CTRL_VOL rises, the frequency of the frequency multiplication clock FREQ_MTP_CLK rises. Similarly, as the level of the control voltage CTRL_VOL decreases, the frequency of the frequency multiplication clock FREQ_MTP_CLK decreases.

The frequency detector 650 inactivates the frequency detection signal FREQ_DET if a time interval corresponding to one clock cycle 1 tck of the source clock REF_CLK is greater than a time interval corresponding to one clock cycle of the frequency multiplication clock FREQ_MTP_CLK by a multiplication factor equal to or more than a preset multiplication factor. On the other hand, it activates the frequency detection signal FREQ_DET if a time interval corresponding to one clock cycle 1 tck of the source clock REF_CLK is greater than a time interval corresponding to one clock cycle of the frequency multiplication clock FREQ_MTP_CLK by less than a preset multiplication factor.

That is, if a locking operation is normally performed without occurrence of harmonic locking and thus a phase difference between the source clock REF_CLK and the feedback clock FEDB_CLK corresponds to one clock cycle 1 tck of the source clock REF_CLK, the frequency of the frequency multiplication clock FREQ_MTP_CLK should be greater than the frequency of the source clock REF_CLK by a multiplication factor equal to or more than a preset multiplication factor.

However, if harmonic locking has occurred and thus a phase difference between the source clock REF_CLK and the feedback clock FEDB_CLK corresponds to two or more clock cycles (tck), the frequency of the frequency multiplication clock FREQ_MTP_CLK should be greater than the frequency of the source clock REF_CLK by less than a preset multiplication factor.

Thus, if a time interval corresponding to one clock cycle 1 tck of the source clock REF_CLK is greater than a time interval corresponding to one clock cycle of the frequency multiplication clock FREQ_MTP_CLK by a multiplication factor equal to or more than a preset multiplication factor, the frequency detector 650 determines that a harmonic locking has not occurred and thus inactivates the frequency detection signal FREQ_DET and outputs it. On the other hand, if a time interval corresponding to one clock cycle 1 tck of the source clock REF_CLK is greater than a time interval corresponding to one clock cycle of the frequency multiplication clock FREQ_MTP_CLK by less than the preset multiplication factor, it determines that a harmonic locking has occurred and thus activates the frequency detection signal FREQ_DET and outputs it.

The level detector 660 activates the level detection signal LV_DET and outputs it when levels of odd (or even or other sequential orders such as multiples of n where n is any natural number) toggling pulses of the source clock REF_CLK are in an active state at reference edges of odd (or even or other sequential orders such as multiples of n where n is any natural number) toggling pulses of the feedback clock FEDB_CLK, wherein the reference edge is generally a rising edge of odd toggling pulses but in another example, may be a falling edge thereof). On the other hand, it inactivates the level detection signal LV_DET and outputs the same when levels of odd (or even or other sequential orders such as multiples of n where n is any natural number) toggling pulses of the source clock REF_CLK are in an inactive state at reference edges of odd (or even or other sequential orders such as multiples of n where n is any natural number) toggling pulses of the feedback clock FEDB_CLK.

At this time, the process, in which a locking operation is normally performed, adopts the following method. That is, a locking operation first starts at a state where a phase difference between the source clock REF_CLK and the feedback clock FEDB_CLK is less than one clock cycle 1 tck of the source clock REF_CLK. Then, the delay amount of the clock delay unit 600 is increased more and more. At this time, if a phase difference between the source clock REF_CLK and the feedback clock FEDB_CLK becomes greater than one clock cycle 1 tck of the source clock REF_CLK, the delay amount of the clock delay unit 600 is decreased again. In this way, through the operation in which the delay amount of the clock delay unit 600 is repeatedly increased and decreased, when a phase difference between the source clock REF_CLK and the feedback clock FEDB_CLK is exactly equal to one clock cycle 1 tck of the source clock REF_CLK, the locking operation is completed.

In other words, when the locking operation is normally performed without occurrence of harmonic locking, the reference edge of the feedback clock FEDB_CLK repeatedly precedes and lags behind the reference edge of the source clock REF_CLK and the level of the source clock REF_CLK is repeatedly switched between being logic 'low' and logic 'high' at the reference edge of the feedback clock FEDB_CLK.

During this operation, when the reference edge of the feedback clock FEDB_CLK precedes the reference edge of the source clock REF_CLK by one clock cycle 1 tck due to occurrence of harmonic locking, the phase detector 620 intends to synchronize the reference edge of the feedback clock FEDB_CLK with a reference edge of the source clock REF_CLK which precedes its original reference edge by one clock cycle 1 tck by further decreasing the delay amount of the clock delay unit 600. However, since the minimum value of the clock delay unit 600 is not '0', the reference edge of the feedback clock FEDB_CLK still lags behind the reference edge of the source clock REF_CLK by one clock cycle 1 tck. That is, the level of the source clock REF_CLK is still activated to logic 'high' at the reference edge of the feedback clock FEDB_CLK.

Thus, the level detector 660 activates or inactivates the level detection signal LV_DET by detecting the state that the level of the source clock REF_CLK is activated to logic 'high' at the reference edge of the feedback clock FEDB_CLK. However, if it is determined that a harmonic locking has occurred by considering only the state that the level of the source clock REF_CLK is activated to logic 'high' at the reference edge of the feedback clock FEDB_CLK, it may be determined that a harmonic locking has occurred even when the level of the source clock REF_CLK is activated to logic 'high' at the reference edge of the feedback clock FEDB_CLK during the normal locking operation.

Thus, the level detector 660 does not detect a level of every toggling pulse of the source clock REF_CLK at every reference edge of the feedback clock FEDB_CLK, but detects levels of odd (or even or other sequential orders such as multiples of n where n is any natural number) toggling pulses of the source clock REF_CLK at the reference edge of odd (or even or other sequential orders such as multiples of n where n is any natural number) toggling pulses of the feedback clock FEDB_CLK, thereby preventing that the normal locking state is determined as a harmonic locking state. At this time, determining based on the odd (or even or other sequential orders such as multiples of n where n is any natural number) toggling pulses of the feedback clock FEDB_CLK and odd (or even or other sequential orders such as multiples of n where n is any natural number) toggling pulses of the source clock REF_CLK is to make sure that the reference clock to be locked is not included in the selected toggling pulses of the feedback clock FEDB_CLK and the source clock REF_CLK. That is, detecting levels of odd toggling pulses (or even or other sequential orders such as multiples of n where n is any natural number) of the source clock REF_CLK at the reference edges of odd (or even or other sequential orders such as multiples of n where n is any natural number) toggling pulses of the feedback clock FEDB_CLK can prevent the reference edge of the feedback clock FEDB_CLK from being locked into the reference edge of a pulse positioned before or after the reference edge of the source clock REF_CLK to be locked.

Thus, if levels of odd (or even or other sequential orders such as multiples of n where n is any natural number) toggling pulses of the source clock REF_CLK are activated to logic 'high' at reference edges of odd (or even or other sequential orders such as multiples of n where n is any natural number) toggling pulses of the feedback clock FEDB_CLK, the level detector 660 determines that a harmonic locking has occurred and activates the level detection signal LV_DET and outputs it. On the other hand, if levels of odd (or even or other sequential orders such as multiples of n where n is any natural number) toggling pulses of the source clock REF_CLK are inactivated to logic 'low' at reference edges of odd (or even or other sequential orders such as multiples of n where n is any natural number) toggling pulses of the feedback clock FEDB_CLK, it determines that a harmonic locking has not occurred and inactivates the level detection signal LV_DET and outputs the same.

The phase detector 620 compares a reference edge of the source clock REF_CLK with a reference edge of the feedback clock FEDB_CLK, wherein the reference edge is generally a rising edge, but in another example, may be a falling edge. If a reference edge of the feedback clock FEDB_CLK lags behind a reference edge of the source clock REF_CLK or in response to activation of the frequency detection signal FREQ_DET in the state where the level detection signal LV_DET is inactivated, the phase detector 620 outputs the level up signal LVUP of active state. If a reference edge of the feedback clock FEDB_CLK precedes a reference edge of the source clock REF_CLK or in response to activation of the level detection signal LV_DET in the state where the frequency detection signal FREQ_DET is inactivated, the phase detector 620 outputs the level down signal LVDN of active state. If the reference edges of the source clock REF_CLK and the feedback clock FEDB_CLK are synchronized with each other, the phase detector 620 activates both the level up signal LVUP and the level down signal LVDN and outputs them.

At this time, the length of active intervals of the level up signal LVUP and level down signal LVDN may vary depending on a difference between reference edges of the source clock REF_CLK and the feedback clock FEDB_CLK, but do not vary depending on the level detection signal LV_DET or the frequency detection signal FREQ_DET.

That is, in the normal locking state, the phase detector 620 varies the length of active intervals of the level up signal LVUP and level down signal LVDN depending on a difference between reference edges of the source clock REF_CLK and the feedback clock FEDB_CLK; and but, in harmonic locking state, outputs the level up signal LVUP and level down signal LVDN with the preset length of active intervals.

Also, active intervals of each of the phase detection signals clock LVUP and LVDN do not overlap those of the other one of the phase detection signals clock LVUP and LVDN in the phase detector 520, and the operation of activating the level up signal LVUP and the level down signal LVDN based on the activation of the level detection signal LV_DET and the frequency detection signal FREQ_DET should have priority to the operation of activating the level up signal LVUP and level down signal LVDN depending on a difference between reference edges of the source clock REF_CLK and the feedback clock FEDB_CLK.

Also, the voltage level adjustor 640 raises the level of the control voltage CTRL_VOL in response to the activation of the level up signal LVUP, and lowers the level of the control voltage CTRL_VOL in response to the activation of the level down signal LVDN.

As described above, the present invention can essentially prevent harmonic locking which occurs during the locking operation by having, in a DLL circuit, the frequency detector 350 or 650 and the level detector 360 or 660 for preventing harmonic locking.

It should be noted that the logic gates and transistors used in the embodiments set forth above may be arranged in different positions and implemented in different types depending on the polarity of input signals.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
a clock delay unit configured to include a plurality of delay units connected in series, where the delay amount of each delay unit varies depending on a level of a control voltage, for delaying a source clock to generate a feedback clock and mixing clocks outputted from the respective delay units to generate a frequency multiplication clock;
a harmonic lock determination unit configured to determine whether a harmonic lock has occurred based on a frequency difference between the source clock and the frequency multiplication clock, wherein the frequency difference is detected by a frequency detector included in the harmonic lock determination unit; and
a control voltage generator configured to adjust a level of the control voltage based on a phase difference between the source clock and the feedback clock and a determination result of the harmonic lock determination unit.

2. The semiconductor device of claim 1, wherein the harmonic lock determination unit is configured to:
determine that a harmonic lock has not occurred if a time interval corresponding to one clock cycle of the source clock is greater than a time interval corresponding to one clock cycle of the frequency multiplication clock by a multiplication factor equal to or more than a preset multiplication factor, and
determine that a harmonic lock has occurred if a time interval corresponding to one clock cycle of the source clock is greater than a time interval corresponding to one clock cycle of the frequency multiplication clock by less than the preset multiplication factor.

3. The semiconductor device of claim 2, wherein, if the harmonic lock determination unit determines that a harmonic lock has not occurred, the control voltage generator is configured to:
raise a level of the control voltage if a reference edge of the feedback clock lags behind a reference edge of the source clock,
lower a level of the control voltage if a reference edge of the feedback clock precedes a reference edge of the source clock, and
do not vary a level of the control voltage if a reference edge of the feedback clock is synchronized with a reference edge of the source clock.

4. The semiconductor device of claim 1, wherein the harmonic lock determination unit includes:
a clock divider configured to divide the frequency of the source clock by two to output a divided source clock;
an edge counter configured to count the number of reference edges of the frequency multiplication clock during an active interval of the divided source clock and determine whether a harmonic lock has occurred based on a counting result; and
an initialization controller configured to initialize the edge counter in response to inactivation of the divided source clock.

5. The semiconductor device of claim 4, wherein the edge counter is configured to:
determine that a harmonic lock has not occurred if the number of reference edges of the frequency multiplication clock counted during the active interval of the divided source clock is greater than a preset number, and
determine that a harmonic lock has occurred if the number of reference edges of the frequency multiplication clock counted during the active interval of the divided source clock is less than the preset number.

6. A semiconductor device, comprising:
a clock delay unit configured to include a delay unit, whose delay amount is decided depending on a level of a control voltage, for delaying a source clock to generate a feedback clock;
a harmonic lock determination unit configured to detect a level of the source clock at a preset reference edge of the feedback clock to determine whether a harmonic lock has occurred; and
a control voltage generator configured to adjust a level of the control voltage based on a phase difference between the source clock and the feedback clock and a determination result of the harmonic lock determination unit.

7. The semiconductor device of claim 6, wherein the harmonic lock determination unit is configured to:
determine that a harmonic lock has occurred when levels of non-consecutive sequence of toggling pulses of the source clock are in an active state at reference edges of the same-ordered sequence of toggling pulses of the feedback clock, and
determine that a harmonic lock has not occurred when levels of non-consecutive sequence of toggling pulses of the source clock are in an inactive state at reference edges of the same-ordered sequence of toggling pulses of the feedback clock.

8. The semiconductor device of claim 7, wherein, if the harmonic lock determination unit determines that a harmonic lock has not occurred, the control voltage generator is configured to:
raise a level of the control voltage if a reference edge of the feedback clock lags behind a reference edge of the source clock,
lower a level of the control voltage if a reference edge of the feedback clock precedes a reference edge of the source clock, and
do not vary a level of the control voltage if a reference edge of the feedback clock is synchronized with a reference edge of the source clock.

9. The semiconductor device of claim 6, wherein the harmonic lock determination unit includes:
a source pulse generator configured to count the number of toggling pulses of the source clock to generate a source pulse;
a feedback pulse generator configured to count the number of toggling pulses of the feedback clock to generate a feedback pulse;
a level detection signal output unit configured to determine whether a harmonic lock has occurred in response to a level of the source pulse at a reference edge of the feedback clock; and
an initialization controller configured to initialize a count value of the source pulse generator in response to inactivation of the source pulse, and to initialize a count value of the feedback pulse generator in response to inactivation of the feedback pulse.

10. The semiconductor device of claim 9, wherein the level detection signal output unit is configured to:
determine that a harmonic lock has occurred when the source pulse is in an active state at the reference edge of the feedback pulse, and
determine that a harmonic lock has not occurred when the source pulse is in an inactive state at the reference edge of the feedback pulse.

11. A semiconductor device, comprising:
a clock delay unit configured to include a plurality of delay units connected in series, wherein the delay amount of each delay unit varies depending on a level of a control voltage, for delaying a source clock to generate a feedback clock and mixing clocks outputted from the respective delay units to generate a frequency multiplication clock;

a phase detector configured to detect a phase difference between the source clock and the feedback clock to generate a phase detection signal;

a frequency detector configured to detect a frequency difference between the source clock and the frequency multiplication clock to generate a frequency detection signal;

a level detector configured to detect a level of the source clock at a preset reference edge of the feedback clock to generate a level detection signal; and a voltage level adjustor configured to adjust a level of the control voltage in response to the phase detection signal, the frequency detection signal and the level detection signal.

12. The semiconductor device of claim 11, wherein the phase detection signal includes at least one of first and second phase detection signals, where active intervals of each of the first and second phase detection signals do not overlap those of the other one of the first and second phase detection signals.

13. The semiconductor device of claim 12, wherein the phase detector is configured to:

compare a reference edge of the source clock with a reference edge of the feedback clock, if the reference edge of the feedback clock lags behind the reference clock of the source clock, activate the first phase detection signal, if the reference edge of the feedback clock precedes the reference clock of the source clock, activate the second phase detection signal, and if the reference edge of the source clock is synchronized with the reference clock of the feedback clock, inactivate both the first phase detection signal and the second phase detection signal.

14. The semiconductor device of claim 13, wherein the frequency detector is configured to:

inactivate the frequency detection signal if a time interval corresponding to one clock cycle of the source clock is greater than a time interval corresponding to one clock cycle of the frequency multiplication clock by a multiplication factor equal to or more than a preset multiplication factor, and activate the frequency detection signal if a time interval corresponding to one clock cycle of the source clock is greater than a time interval corresponding to one clock cycle of the frequency multiplication clock by less than the preset multiplication factor.

15. The semiconductor device of claim 14, wherein the level detector is configured to:

activate the level detection signal when levels of non-consecutive sequence of toggling pulses of the source clock are in an active state at reference edges of the same-ordered sequence of toggling pulses of the feedback clock, and inactivate the level detection signal when levels of the non-consecutive sequence of toggling pulses of the source clock are in an inactive state at reference edges of the same-ordered sequence of toggling pulses of the feedback clock.

16. The semiconductor device of claim 15, wherein the voltage level adjustor is configured to:

raise a level of the control voltage in response to activation of the first phase detection signal or activation of the frequency detection signal upon inactivation of the level detection signal, and lower a level of the control voltage in response to activation of the second phase detection signal or activation of the level detection signal upon inactivation of the frequency detection signal.

17. The semiconductor device of claim 11, wherein the frequency detector includes:

a clock divider configured to divide the frequency of the source clock by two to output a divided source clock;

an edge counter configured to count the number of reference edges of the frequency multiplication clock during an active interval of the divided source clock and output the frequency detection signal whose logic level is determined based on a counting result; and an initialization controller configured to initialize the edge counter in response to inactivation of the divided source clock.

18. The semiconductor device of claim 17, wherein the edge counter is configured to:

output the frequency detection signal of inactive state if the number of reference edges of the frequency multiplication clock counted during the active interval of the divided source clock is greater than a preset number, and output the frequency detection signal of active state if the number of reference edges of the frequency multiplication clock counted during the active interval of the divided source clock is less than the preset number.

19. The semiconductor device of claim 11, wherein the level detector includes:

a source pulse generator configured to count the number of toggling pulses of the source clock to generate a source pulse;

a feedback pulse generator configured to count the number of toggling pulses of the feedback clock to generate a feedback pulse;

a level detection signal output unit configured to output the level detection signal whose logic level is determined in response to a level of the source pulse at a reference edge of the feedback clock; and an initialization controller configured to initialize a count value of the source pulse generator in response to inactivation of the source pulse, and to initialize a count value of the feedback pulse generator in response to inactivation of the feedback pulse.

20. The semiconductor device of claim 19, wherein the level detection signal output unit is configured to:

output the level detection signal of active state when the source pulse is in an active state at the reference edge of the feedback clock, and output the level detection signal of inactive state when the source pulse is in an inactive state at the reference edge of the feedback clock.

21. A semiconductor device, comprising:

a clock delay unit configured to include a plurality of delay units connected in series, where the delay amount of each delay unit varies depending on a level of a control voltage, for delaying a source clock to generate a feedback clock and mixing clocks outputted from the respective delay units to generate a frequency multiplication clock;

a frequency detector configured to detect a frequency difference between the source clock and the frequency multiplication clock to generate a frequency detection signal;

a level detector configured to detect a level of the source clock at a preset reference edge of the feedback clock to generate a level detection signal;

a phase detector configured to detect a phase difference between the source clock and the feedback clock to generate a level up signal and a level down signal based on a detection result, the frequency detection signal and the level detection signal; and a voltage level adjustor configured to raise a level of the control voltage in response to the level up signal and lower a level of the control voltage in response to the level down signal.

22. The semiconductor device of claim 21, wherein the frequency detector is configured to:

inactivate the frequency detection signal if a time interval corresponding to one clock cycle of the source clock is greater than a time interval corresponding to one clock cycle of the frequency multiplication clock by a multiplication factor equal to or more than a preset multiplication factor, and activate the frequency detection signal if a time interval corresponding to one clock cycle of the source clock is greater than a time interval corresponding to one clock cycle of the frequency multiplication clock by less than the preset multiplication factor.

23. The semiconductor device of claim 22, wherein the level detector is configured to:

activate the level detection signal when levels of non-consecutive sequence of toggling pulses of the source clock are in an active state at reference edges of the same-ordered sequence of toggling pulses of the feedback clock, and inactivate the level detection signal when levels of the non-consecutive sequence of toggling pulses of the source clock are in an inactive state at reference edges of the same-ordered sequence of toggling pulses of the feedback clock.

24. The semiconductor device of claim 23, wherein the phase detector is configured to:

compare a reference edge of the source clock with a reference edge of the feedback clock, and output the level up signal of active state if the reference edge of the feedback clock lags behind the reference clock of the source clock or in response to activation of the frequency detection signal upon inactivation of the level detection signal, output the level down signal of active state if the reference edge of the feedback clock precedes the reference clock of the source clock or in response to activation of the level detection signal upon inactivation of the frequency detection signal, and inactivate both the level up signal and the level down signal if the reference edge of the source clock is synchronized with the reference clock of the feedback clock.

25. The semiconductor device of claim 24, wherein active intervals of the level up signal do not overlap active intervals of the level down signal.

26. The semiconductor device of claim 21, wherein the frequency detector includes:

a clock divider configured to divide the frequency of the source clock by two to output a divided source clock;

an edge counter configured to count the number of reference edges of the frequency multiplication clock during an active interval of the divided source clock and output the frequency detection signal whose logic level is determined based on a counting result; and an initialization controller configured to initialize the edge counter in response to inactivation of the divided source clock.

27. The semiconductor device of claim 26, wherein the edge counter is configured to:

output the frequency detection signal of inactive state if the number of reference edges of the frequency multiplication clock counted during the active interval of the divided source clock is greater than a preset number, and output the frequency detection signal of active state if the number of reference edges of the frequency multiplication clock counted during the active interval of the divided source clock is less than the preset number.

28. The semiconductor device of claim 21, wherein the level detector includes:

a source pulse generator configured to count the number of toggling pulses of the source clock to generate a source pulse;

a feedback pulse generator configured to count the number of toggling pulses of the feedback clock to generate a feedback pulse;

a level detection signal output unit configured to output the level detection signal whose logic level is determined in response to a level of the source pulse at a reference edge of the feedback clock; and an initialization controller configured to initialize a count value of the source pulse generator in response to inactivation of the source pulse, and initialize a count value of the feedback pulse generator in response to inactivation of the feedback pulse.

29. The semiconductor device of claim 28, wherein the level detection signal output unit is configured to:

output the level detection signal of active state when the source pulse is in an active state at the reference edge of the feedback clock, and output the level detection signal of inactive state when the source pulse is in an inactive state at the reference edge of the feedback clock.

* * * * *